(12) United States Patent
Markku

(10) Patent No.: US 9,209,324 B2
(45) Date of Patent: Dec. 8, 2015

(54) PHOTOVOLTAIC CELL ARRANGEMENTS

(75) Inventor: Rouvala Markku, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 496 days.

(21) Appl. No.: 13/642,797

(22) PCT Filed: Apr. 28, 2010

(86) PCT No.: PCT/EP2010/055743
§ 371 (c)(1),
(2), (4) Date: Oct. 22, 2012

(87) PCT Pub. No.: WO2011/134512
PCT Pub. Date: Nov. 3, 2011

(65) Prior Publication Data
US 2013/0038268 A1    Feb. 14, 2013

(51) Int. Cl.
*H02J 7/00* (2006.01)
*H02J 7/14* (2006.01)
*H01L 31/0224* (2006.01)
(Continued)

(52) U.S. Cl.
CPC ........ *H01L 31/022433* (2013.01); *H01Q 1/248* (2013.01); *H01Q 1/36* (2013.01); *H01Q 1/44* (2013.01); *H01Q 9/27* (2013.01);
(Continued)

(58) Field of Classification Search
USPC ......... 320/101, 108, 107, 115, 103, 114, 116, 320/138; 455/572, 573, 566, 575.1, 414.1, 455/574, 575.3
See application file for complete search history.

(56) References Cited

U.S. PATENT DOCUMENTS 3,966,499 A    6/1976   Yasui et al.
4,228,315 A *  10/1980  Napoli .......................... 136/256
(Continued)

FOREIGN PATENT DOCUMENTS

CN    1703533 A    11/2005
DE    19954259 A1   5/2001
(Continued)

OTHER PUBLICATIONS

English Language Machine Translation of Chinese Patent Application Publication No. CN1703533A, 8 pages.
(Continued)

*Primary Examiner* — Edward Tso
*Assistant Examiner* — Alexis A Boateng
(74) *Attorney, Agent, or Firm* — Locke Lord LLP

(57) ABSTRACT

Apparatus comprise a photovoltaic cell arrangement having a front surface and a rear surface, and first and second conductor patterns formed on different ones of the front and rear surfaces. The first conductor pattern comprises at least one loop, and the apparatus comprises at least a first terminal connected to the second conductor pattern, and second and third terminals connected to different ends of the at least one loop of the first conductor pattern. A transducer arrangement comprises a transducer body having a front surface and a rear surface, and first and second conductor patterns formed on different ones of the front and rear surfaces. The first conductor pattern comprises at least one loop. The transducer arrangement comprises at least a first terminal connected to the second conductor pattern, and second and third terminals connected to different ends of the at least one spiral loop of the first conductor pattern. The transducer body and the first and second conductor patterns together form a photovoltaic transducer arrangement and the second conductor pattern constitutes an induction transducer.

20 Claims, 8 Drawing Sheets

(51) Int. Cl.
  *H02J 7/35* (2006.01)
  *H01Q 1/44* (2006.01)
  *H02S 10/40* (2014.01)
  *H01Q 1/24* (2006.01)
  *H01Q 1/36* (2006.01)
  *H01Q 9/27* (2006.01)
  *H02J 7/02* (2006.01)

(52) U.S. Cl.
  CPC ............... *H02J 7/355* (2013.01); *H02S 10/40* (2014.12); *H02J 7/025* (2013.01); *Y02E 10/50* (2013.01)

(56) References Cited

U.S. PATENT DOCUMENTS

| | | | | |
|---|---|---|---|---|
| 5,409,550 | A | * | 4/1995 | Safir ............................. 136/246 |
| 5,644,207 | A | * | 7/1997 | Lew et al. ..................... 320/101 |
| 6,608,464 | B1 | * | 8/2003 | Lew et al. ..................... 320/107 |
| 8,626,250 | B2 | * | 1/2014 | Won et al. ..................... 455/573 |
| 2007/0087564 | A1 | * | 4/2007 | Speakman ..................... 438/674 |
| 2007/0240757 | A1 | | 10/2007 | Ren et al. |
| 2008/0252254 | A1 | * | 10/2008 | Osada ........................... 320/108 |
| 2009/0137287 | A1 | * | 5/2009 | Hsiao ............................ 455/572 |
| 2009/0258606 | A1 | | 10/2009 | Ramus |
| 2010/0078230 | A1 | * | 4/2010 | Rosenblatt et al. ......... 178/18.01 |
| 2010/0079387 | A1 | * | 4/2010 | Rosenblatt et al. ........... 345/173 |
| 2010/0120473 | A1 | * | 5/2010 | Oh ................................. 455/566 |
| 2010/0167797 | A1 | * | 7/2010 | Morichi ........................ 455/572 |
| 2010/0276573 | A1 | * | 11/2010 | Duerksen ................... 250/208.6 |
| 2011/0193519 | A1 | * | 8/2011 | Alderman ..................... 320/101 |
| 2012/0153893 | A1 | * | 6/2012 | Schatz et al. .................. 320/108 |

FOREIGN PATENT DOCUMENTS

| | | |
|---|---|---|
| DE | 19954259A1 B4 | 5/2001 |
| DE | 19954259 B4 | 9/2005 |
| JP | 2010081711 | 4/2010 |
| WO | WO9739491 | 10/1997 |
| WO | WO 2008149658 A1 * | 12/2008 |

OTHER PUBLICATIONS

English Language Machine Translation of German Patent Application Publication No. DE19954259A1, 16 pages.

English Language Machine Translation of German Patent Application Publication No. DE19954259B4, 16 pages.

International Search Report for International Application No. PCT/EP2010/055743—Date of Completion of Search: Mar. 31, 2011, 4 pages.

* cited by examiner

PHOTOVOLTAIC CELL ARRANGEMENTS

FIELD OF THE INVENTION

This invention relates to apparatus including a photovoltaic cell arrangement.

BACKGROUND TO THE INVENTION

It is known to provide a handheld portable device, such as a mobile telephone, with an integrated solar cell arrangement for powering device using solar energy. It is known in some such devices also to charge a battery of the device using solar power.

SUMMARY OF THE INVENTION

A first aspect provides apparatus comprising:
 a photovoltaic cell arrangement having:
  a front surface and a rear surface, and
  first and second conductor patterns formed on different ones of the front and rear surfaces,
wherein the first conductor pattern comprises at least one loop,
and wherein the apparatus comprises at least a first terminal connected to the second conductor pattern, and second and third terminals connected to different ends of the at least one loop of the first conductor pattern.

A second aspect provides a transducer arrangement comprising:
 a transducer body having:
  a front surface and a rear surface, and
  first and second conductor patterns formed on different ones of the front and rear surfaces,
wherein the first conductor pattern comprises at least one loop,
wherein the transducer arrangement comprises at least a first terminal connected to the second conductor pattern, and second and third terminals connected to different ends of the at least one spiral loop of the first conductor pattern,
wherein the transducer body and the first and second conductor patterns together form a photovoltaic transducer arrangement and wherein the second conductor pattern constitutes an induction transducer.

Embodiments of the present invention will now be described, by way of example only, with reference to the accompanying drawings.

DETAILED DESCRIPTION OF THE EMBODIMENTS

Figure 1:
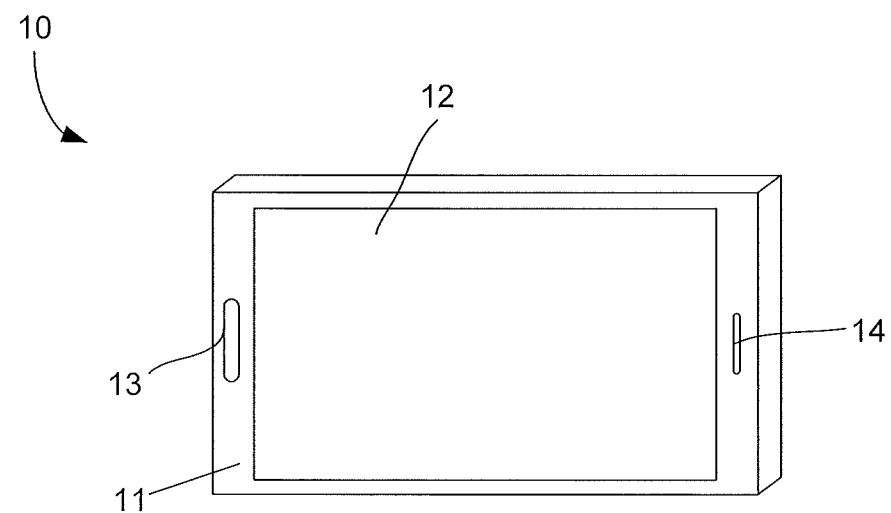
FIG. 1 is a perspective view of front and rear faces of a device, in this example a mobile telephone, according to aspects of the invention.
Figure 1:
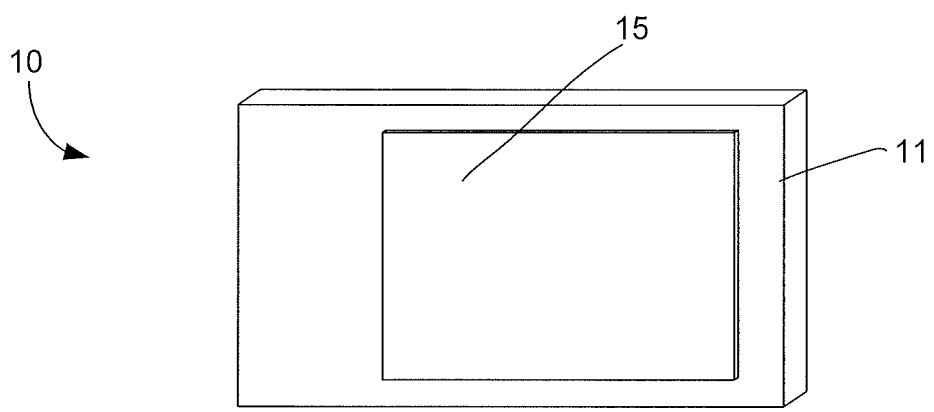

Referring firstly to FIG. 1, a device 10, which in this example is a mobile telephone or smart phone, is illustrated. The largest face visible in the uppermost part of the Figure is the front face of the device 10. The largest face visible in the lowermost part of the Figure is the rear face of the device 10. The other faces are side faces.

The device includes a housing 11, which may take any suitable form. On the front face of the device 10 is a touch screen 12. The touch screen 12 comprises the majority of the area of the front face of the device 10. At one end of the front face of the device 10 is a speaker aperture 13 and at the other end is a microphone aperture 14.

A transducer arrangement 15 is provided on the rear face of the device 10. The transducer arrangement 15 occupies more than half of the area of the rear face of the device 10.

The transducer arrangement 15 comprises one or more solar cells. The transducer arrangement 15 is integrated with the housing 11. Alternatively, the transducer arrangement 15 is fixedly connected to the housing 11. Alternatively, the transducer arrangement 15 is provided as part of a removable rear cover of the housing 11.

Figure 2:
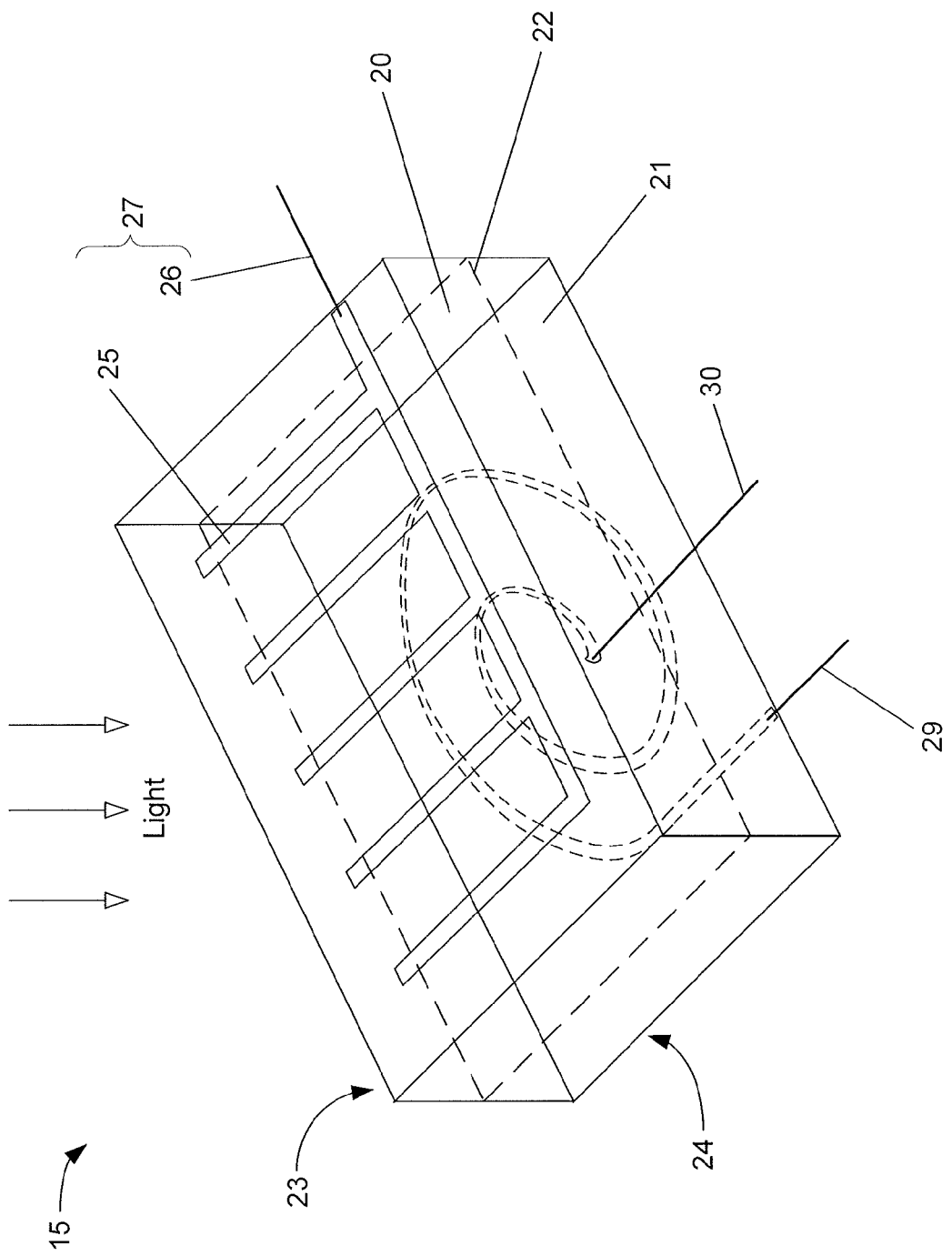
FIG. 2 is a schematic perspective view of a transducer arrangement forming part of the FIG. 1 device.

FIG. 2 is a schematic drawing illustrating a novel transducer arrangement 15. FIG. 2 is a schematic perspective view. The view is partially transparent so that a number of relevant features are visible.

The transducer arrangement 15 is a composite arrangement in that it includes a solar cell arrangement and an inductive coil arrangement.

The transducer arrangement 15 comprises an n-doped layer of semiconductor 20 and a p-doped layer of semiconductor 21. Between the n-doped and p-doped layers 20, 21 is a p-n junction 22. The side of the n-doped layer that is opposite the p-n junction 22 constitutes a front face 23 of the transducer arrangement 15. Similarly, a face of the p-doped layer 21 that is opposite to the p-n junction 22 constitutes a back or rear face 24 of the transducer arrangement 15. The n-doped and p-doped layers 20, 21 may instead the other way around, with the p-doped layer of semiconductor 21 constituting the front face 23 and the n-doped layer of semiconductor 20 constituting the rear face 24.

Formed on the front face 23 is a first transparent conductive oxide (TCO) pattern 25. A first terminal 26 is electrically connected to the first TCO pattern 25. The first terminal 26 and the first TCO pattern 25 together constitute a front electrode 27 of the solar cell part of the transducer arrangement 15. The front electrode 27 is shown in FIG. 2 as having the form of a rake. Alternative forms are described below.

The first TCO pattern 25 is comprised of a transparent material, such as titanium dioxide. Tines of the first TCO pattern 25, as well as a member connecting the tines together and to the first terminal 26, are generally rectangular. The first TCO pattern 25 has a thickness. The first TCO pattern 25 is wholly or substantially transparent to light. As such, light incident on the front face 23 of the transducer arrangement 15 is able to pass through the first TCO pattern 25, as well as between the components of the pattern, towards the p-n junction 22.

On the rear face 24 of the transducer arrangement 15 is a second TCO pattern 28. The TCO pattern takes the form of a loop. In the example shown at FIG. 2, the second TCO pattern 28 takes the form of a spiral. The second TCO pattern 28 has a width and a thickness and is electronically conductive. Second and third terminals 29, 30 are connected at opposite ends of the TCO pattern 28. The third terminal 30 is connected to the inner end of the spiral constituted by the second TCO pattern 28. There is electrical insulation between the third terminal 30 and the parts of the second TCO pattern 28 that are crossed as the third terminal 30 extends from the interior of the spiral to the outside edge of the rear face 24.

The second TCO pattern 28 may comprise titanium dioxide. However, since the second terminal 29 is at the rear of the transducer arrangement 15, optical transparency of the second TCO pattern 28 is not so critical. As such, the TCO pattern 28 may instead comprise a metallisation layer.

Figure 3:
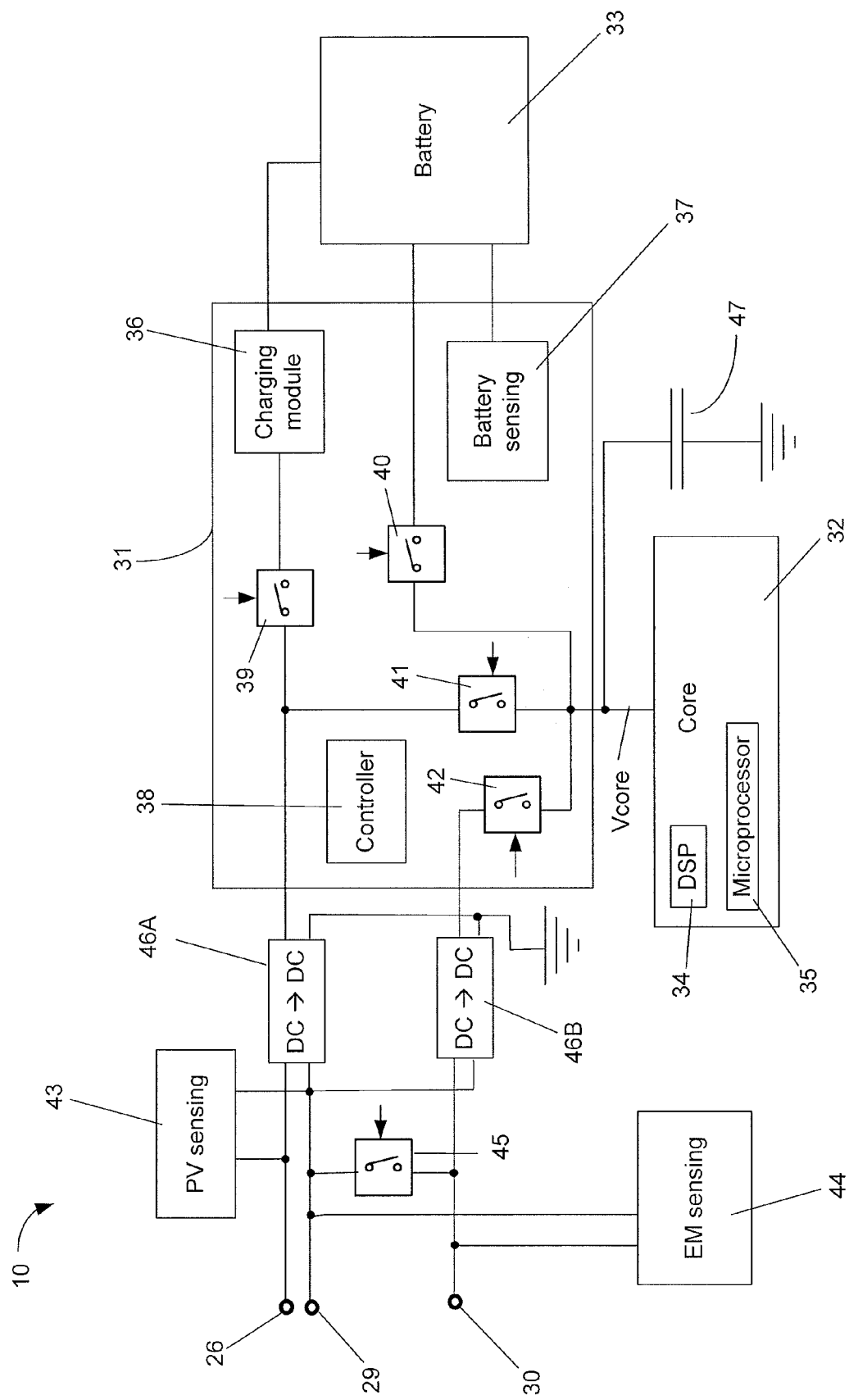
FIG. 3 is a schematic diagram illustrating certain components of the FIG. 1 device.

FIG. 3 is a schematic diagram illustrating certain components of the device 10. The device 10 is shown as comprising generally a power management module 31, a core 32 and a battery 33. The power management module 31 may be implemented as an integrated circuit or chip. The core 32 may include a digital signal processor (DSP) 34 and/or one or more microprocessors 35. If the core 32 includes a DSP 34 and one or more microprocessors 35, these may be on a common chip or on separate chips. The first to third terminals 26, 29, 30, that are connected to the first and second TCO patterns 25, 28 are shown at the left of the Figure. The second terminal 29 is connected to a reference voltage within the device 10, such as ground potential, though indirectly (through DC to DC converters 46A, 46B, discussed below).

The power management module 31 includes a number of components, particularly a charging module 36, a battery sensing module 37 and a controller 38. The power module 31 also includes first to fourth controllable switches 39 to 42. The controller 38 is operable to exert control over and take input from the various other components of the power management module 31, although various connections are omitted from the Figure for the sake of clarity.

Connected across the first and second terminals 26, 29 is a photovoltaic sensing module. Connected across the second and third terminals 29, 30 is an electromagnetic (EM) sensing module 44. By virtue of their connection to the second terminal 29, both of the photovoltaic (PV) sensing module 43 and the electromagnetic sensing module 44 are connected to the reference (ground) potential. The PV sensing module 43 is operable to detect a voltage received at the first and second terminals 26, 29. The voltage produced at these terminals is a consequence of electrical power produced by the solar cell part of the transducer arrangement 15 in the presence of incident light. A voltage is produced by the transducer arrangement 15 because holes and electrons created by the p- and n-doped layers 20, 21, and the p-n junction 22 are captured by the first and second TCO patterns 25, 28.

The EM sensing module 44 is operable to detect a voltage received at the second and third terminals 29, 30. This voltage is a consequence of the induction of electrical current in the loop formed by the second TCO pattern 28 in the presence of magnetic fields in the vicinity of the transducer arrangement 15. Because the transducer arrangement 15 is absent of a sheet-like metallic rear electrode, magnetic fields are able to pass through the transducer arrangement 15 and thus interact with the second TCO pattern 28. A magnetic field may be incident on the transducer arrangement 15 by virtue of the device 10 being placed on an inductive charging mat or pad. The magnetic field may instead be background field, for instance background microwave frequency energy. In the case of the magnetic field being produced by an inductive charging mat or pad, the field is relatively strong, and the potential created at the second and third terminals 29, 30 is relatively large. In some embodiments, the second TCO pattern 28 is operable to generate a battery charging power when the device 10 is placed on an inductive charging matter or pad. These embodiments are not described in detail here.

In the case of the magnetic fields being a result of background electromagnetic radiation, the potential produced at second and third terminals 29, 30 is relatively small. The following description concentrates on the second alternative, which is termed electromagnetic harvesting.

Between the first terminal 26 and the first controllable switch 36 is a first DC to DC converter 46A, which is also referenced to the second terminal 29 and a reference potential, such as ground. The first terminal 26 is selectively connected to the charging module 36 by way of the first controllable switch 39. The charging module 36 is connected to charge the battery 33 in the presence of suitable charging power. The battery connections shown in FIG. 3 are purely schematic, and actual electrical implementations may vary.

The first terminal 26 is connected selectively by the third controllable switch 41 to the core 32. This constitutes a power input of the core 32, and is labelled Vcore. The core also includes a connection to the reference potential, such as ground, that is connected to the second terminal 29. Commonly connected to Vcore are two alternative sources of power. The first is the battery 33, which is connected to Vcore via the second controllable switch 40. The other is the third terminal 30, which is connected to Vcore via a second DC to DC converter 46B, which is external to the power management module 31, and the fourth controllable switch 42, which is internal to the power management module 31. The second DC to DC converter 46B is also referenced to the second terminal 29 and a reference potential, such as ground. Also connected between Vcore and the reference (ground) potential is a supercapacitor 47.

The connection of the supercapacitor 47 between the reference (ground) potential and Vcore provides smoothing of any fluctuations in the voltage provided by the solar cell or by the EM harvesting arrangement. The presence of the supercapacitor 47 ensures that temporary reductions in received power do not result in the core 32 receiving insufficient supply voltage. The capacity of the supercapacitor 47 is sufficient to allow the device 10 to enter into a different core power mode in the event of electrical power from the solar cell or the EM harvesting arrangement suddenly ceasing and without the supply voltage received at the core 32 falling below the operating voltage.

Instead of the PV sensing module 43 and the EM sensing module 44 being external to the power management module 31, they could be internal thereto. Similarly, the fifth controllable switch 45 and the first and second DC to DC converters 46A and 46B, may be internal or external to the power management module 31.

Connected between the second and third terminals 28, 30 is a fifth controllable switch 45.

The device 10 has a number of basic modes of operation, some of which will now be described.

In a PV charging mode, electrical power provided as a result of the incidence of light on the transducer arrangement 15 is used to charge the battery 33. In the PV charging mode, the core 32 is provided with electrical power from the battery 33. In the PV charging mode, the third controllable switch 41 is open, so there is no direct connection between the first terminal 26 and Vcore. The first controllable switch 39 is closed, providing electrical power from the first terminal 26 to the charging module 36, which thereby provides a charging power to the battery 33. The second controllable switch 40 is closed in this mode, which allows electrical power to pass from the battery 33 to Vcore. In this mode, the fourth controllable switch 42 is open, so there is no direct connection between the third terminal 30 and Vcore. In the PV charging mode, the fifth controllable switch 45 is closed, thereby short-circuiting the second and third terminals 29, 30. Short-circuiting of the second and third terminals 29, 30 improves the effectiveness of the second TCO pattern 28 as a rear electrode when the transducer arrangement 15 is operating as a PV cell.

In a PV core power mode, there is no charging of the battery 33 with electrical power produced by the PV cell aspect of the transducer arrangement 15. Instead, electrical power provided by the PV cell of the transducer arrangement 15 is used directly to power the core 32. In this mode, there is no contribution from the EM harvesting aspect of the transducer arrangement 15. In the PV core power mode, the first controllable switch 39 is open, thereby isolating the charging module 36 from the first terminal 26. However, the third controllable switch 41 is closed, thereby connecting the first terminal 26 directly to Vcore. Alternatively, the connection between the first terminal 26 and Vcore may involve a buffer or interface (not shown). In this mode, the fifth controllable switch 45 is closed, thereby shorting the second and third terminals 29 and 30 and increasing the effectiveness of the second TCO pattern 28 as a rear electrode for the PV cell. The fourth controllable switch 42 and the second controllable switch 40 are open in the PV core power mode. As such, the core 32 receives electrical power only from the solar cell by virtue of the first terminal 26 with reference to the reference (ground) potential and thus the (short-circuited) second and third terminals 29, 30.

In an EM core power mode, no contribution is provided by the solar cell part of the transducer arrangement 15. Instead, EM harvesting is used to power the core 32. In this mode, there is no charging of the battery 33. In the EM core power mode, the first, second and third controllable switches 39 to 41 are open and the fourth controllable switch 42 is closed. The fifth controllable switch 45 is open, so there is no short-circuiting of the second and third terminals 29, 30. In this mode, a voltage present between the second and third terminals 29, 30 is provided to Vcore by way of the second DC to DC converter 46B.

In a battery powering mode, no utilisation is made of electrical power received from the solar cell nor from the EM harvesting parts of the transducer arrangement 15.

Illustrative operation of the device 10 will now be described with reference to FIG. 4.

Figure 4:
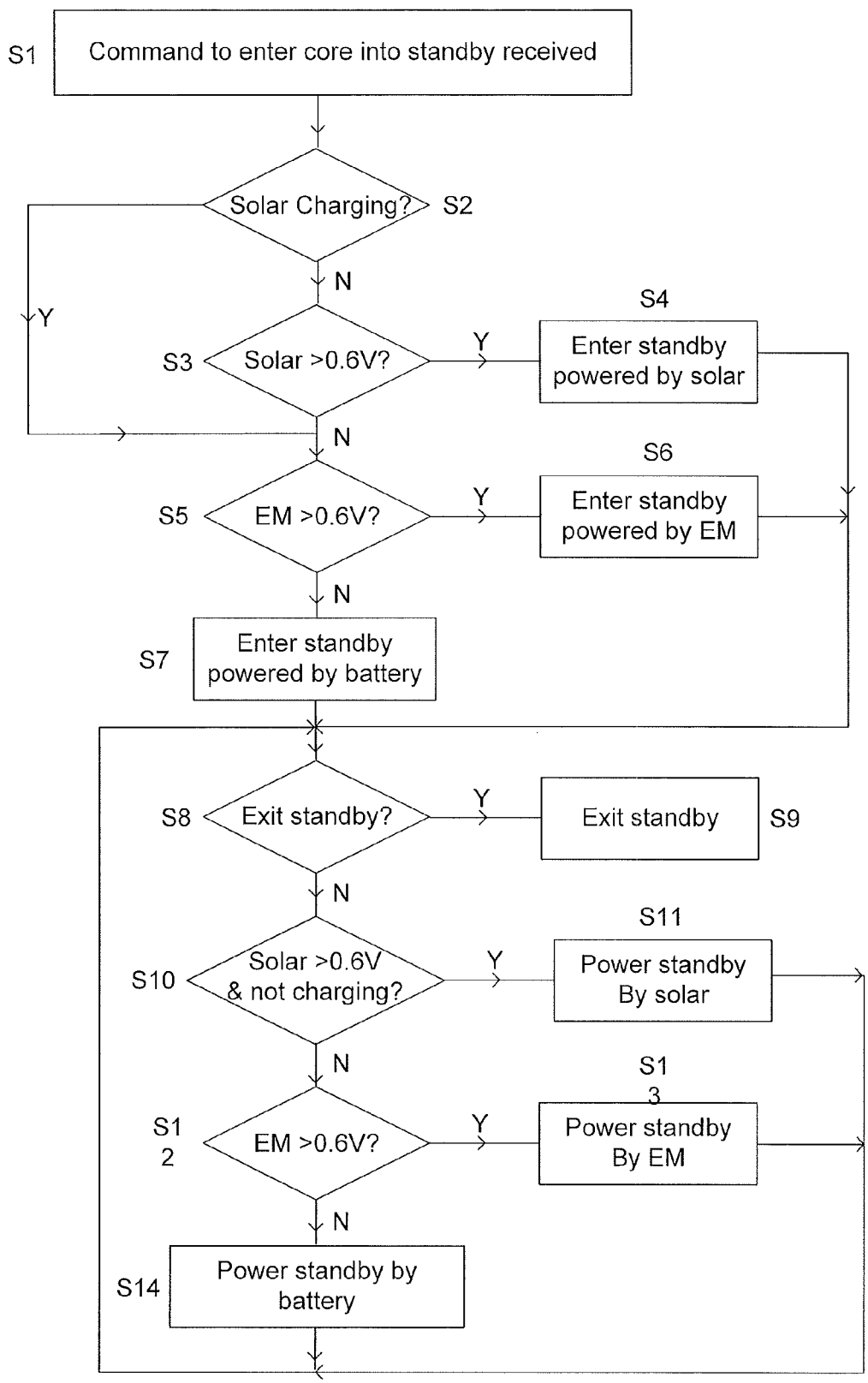
FIG. 4 is a flowchart illustrating operation of a power management chip forming part of the circuit FIG. 3.

FIG. 4 starts at step 1, with the power management module 31 receiving a command to enter the core 32 into standby mode. This command may be received, for instance, as a consequence of receipt of a user input requesting that the device enter standby mode, or may be generated directly by an operating system that runs on the device 10. At step S2, it is determined whether the device 10 is in the PV charging mode. In the event of a negative determination, at step S3 it is determined whether the PV voltage received across the first and second terminals 26, 29 exceeds a threshold, which may for instance be 0.6 V. Step S3 involves the fifth controllable switch 45 being closed, so as to maximise the effectiveness of the second TCO pattern 28 as a rear electrode for the solar cell. In the event of a positive determination at step S3, operation proceeds to step S4, at which the device 10 enters the PV core power mode.

Step S3 involves the PV sensing module 43 detecting the voltage applied to the first and second terminals 26, 29, and averaging the voltage over a period of time. The period of time may for instance be one second. Averaging may be accomplished for instance using a resistor/capacitor (RC) circuit, or a sample and hold circuit, for instance. The voltage threshold may be fixed, for instance at a voltage that corresponds to the maximum voltage permitted to be used by the core 32 when in standby mode. As an example, the threshold may take a value in the range of 0.6V to 1.2V. Alternatively, the threshold may be dynamic. In this case, the threshold is dependent on a value that is provided by the power management module 31. In this case, the power management module 31 is operable to provide the threshold value as being equal a voltage that it has determined is to be supplied to the core 32.

In response to a positive determination from step S2 or a negative determination from step S3, the operation proceeds to step S5. Here, it is determined whether an EM voltage is greater than a threshold. This step involves the EM sensing module 44 measuring or otherwise determining a potential received across the second and third terminals 29, 30. In this step, the fifth controllable switch 45 is held open. The EM sensing module 44 may average the received voltage for a predetermined period of time, which may for instance be one second. Averaging can be achieved using an RC circuit or a sample and hold circuit, for instance. The threshold may be a predetermined threshold, that may take a value for instance between 0.6V and 1.2V. Alternatively, the threshold may be provided by the power management module 31 based on a voltage that the power management module 31 has decided to provide to the core 32.

In the result of a positive determination at step S5, the operation proceeds to step S6, at which the device 10 enters the EM core power mode.

In the result of a negative determination at step S5, the operation proceeds to step S7 where the device enters battery power mode.

Following the entering of standby mode at step S4, step S6 or step S7, it is determined at step S8 whether it is required to exit standby mode. A command to exit standby would normally be issued by the operating system, either because an application or software module requires more than a minimal level of use of the core 32 or because of a user input, or both. If at step S8 it is determined that it is required to exit standby mode, the operation proceeds to step S9, where standby mode is exited. In the event of a negative determination, the operation proceeds to step S10. Here, it is determined whether two conditions are met, the conditions being that the device is not in PV charging mode and that the power produced by the solar cell exceeds a threshold. In the Figure, the threshold is shown as 0.6 volts, although this can take another predetermined value or may instead be dynamically set by the power management module 31. In the event of both conditions being met, the operation proceeds to step S11, where the device enters PV core power mode, or if the device is already in PV core power mode, remains in that mode.

In the event of a negative determination at step S10, the operation proceeds to step S12. Here, the same determination is made as in step S5, described above. In the event of a positive determination, the operation proceeds to step S13. Here, the device enters the EM core power mode, or remains in that mode, as appropriate. In the event of a negative determination at step S12, the operation proceeds to step S14. Here, the device enters battery power mode. Following step S11, step S13 or step S14, the operation proceeds again to step S8.

It will be appreciated that the flowchart of FIG. 4 has a number of effects. Firstly, steps S8 to S14 operate to ensure that the mode of operation of the device 10 can change whilst the core 32 is in standby if the conditions are such that a change in mode is appropriate. The mode of operation of the device 10 can change from battery power mode to either EM core power mode or PV core power mode if the electrical power received from the solar cell or the EM harvesting arrangement becomes sufficient to power the core.

Also, if the power provided by the solar cell or the EM harvesting becomes insufficient to power the core 32, either because the received power decreases or because the power required by the core 32 increases, the device 10 changes into a more appropriate power mode.

In FIG. 4, PV charging mode is given priority over the other modes. In PV charging mode, the energy levels in the battery 33 are replenished, so PV charging mode is the most effective at extending the interval between charges of the battery 33 through connection to an electricity supply. The mode having the next highest priority is the PV core power mode. This has priority over the EM core power mode, which in turn has priority over the battery power mode. As such, the core 32 is powered by the battery 33 only if there is insufficient power provided by the solar cell or by the EM harvesting arrangement. The PV core power mode has a higher priority than the EM core power mode.

Alternatively, the PV core power mode may not have higher priority than the EM core power mode. Instead, the device 10 may be configured to determine which of the solar cell and the EM harvesting arrangement produces the greater voltage, and uses that voltage to power the core 32. Alternatively, the mode may be selected on the basis of which of the solar cell and the EM harvesting is most reliable. In alternative embodiments, the PV core power mode is not given priority over the EM core power mode.

Although not shown in FIG. 4, the device 10 is configured to enter PV charging mode when the PV voltage received at the first and second terminals 26, 29 exceeds a threshold. The threshold is predetermined, and may for instance have a value of 2.5V.

Configurations for the first and second TCO patterns 25, 28 will now be described with reference to FIGS. 5 to 8.

Figure 5:
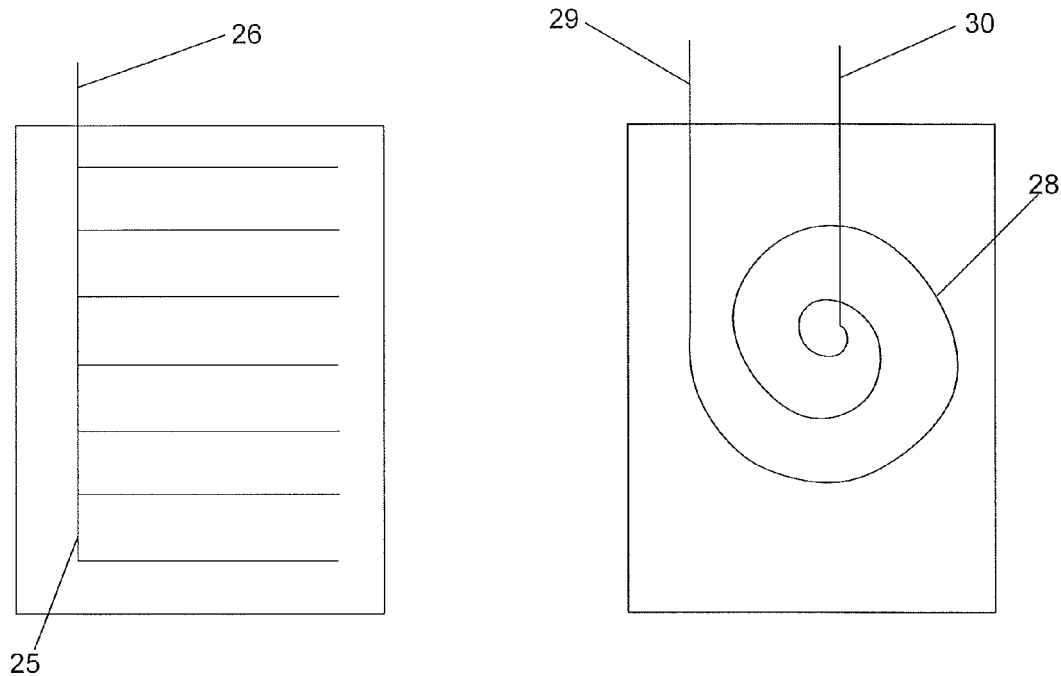
FIGS. 5 to 8 are alternative embodiments of components of the transducer arrangement of FIG. 2.

In FIG. 5, the first TCO pattern 25 is shown to comprise a rake-like arrangement, as shown in FIG. 2. The second TCO pattern 28 is shown to take the form of an approximate circular spiral, with the second and third terminals 28, 30 connected at different ends of the spiral. The spiral is a form of loop. The length of the loop determines the frequencies of electromagnetic signals to which the second TCO pattern 28 is responsive. The arrangement shown at FIG. 5 is a relatively narrow band arrangement, because the spiral has only one length. This allows tuning, in the sense that the second TCO pattern 28 is responsive primarily to a single frequency of electromagnetic signals. This makes the arrangement of FIG. 5, or in particular the second TCO pattern 28 of FIG. 5, to be particularly susceptible for use with inductive charging mats or pads, at which there typically is one dominant frequency of operation.

Figure 6:
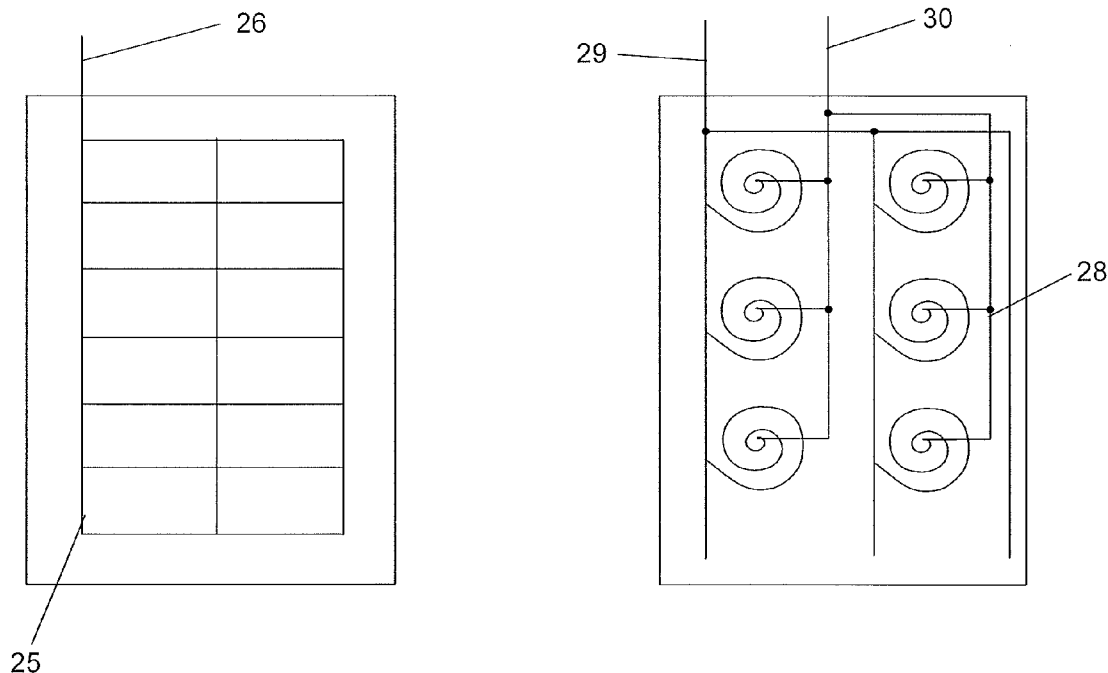

Referring to FIG. 6, the first TCO pattern 25 is shown as having the rake-like structure of the TCO pattern of FIG. 5 although with additional conductors connected across the tines of the rake so as to constitute a grid. This arrangement has improved conductivity over the arrangement of FIG. 5, all other parameters being equal, although at the expense of a slightly larger quantity of TCO material being required.

The second TCO pattern 28 shown in FIG. 6 incorporates plural loops. Here, a number of generally circular spirals are shown. An outer end of each of the spirals is commonly connected to the second terminal 29. An inner end of each of the spirals is connected commonly to the third terminal 30. The use of smaller loops means that the TCO pattern 28 of FIG. 6 is tuned to frequencies higher than the TCO pattern 28 of FIG. 5.

In the arrangement shown in FIG. 6, the number of loops or spirals may be selected such that the proportion of the rear face 24 that is occupied by the TCO pattern 28 is as high as possible. This can maximise the effectiveness of the solar cell. The loops or spirals may have different lengths, although they may have approximately the same lengths. By providing different lengths, a more broadband response can be experienced. By providing the spirals or loops with similar lengths, an improved response may be experienced but only in relation to a relatively narrow band of received electromagnetic energy. In some embodiments, the rear face 24 may be filled with small spirals or loops that are self-impedance matched for very high frequency bands (for instance in the range of 1 Gigahertz to 10 Gigahertz).

Figure 7:
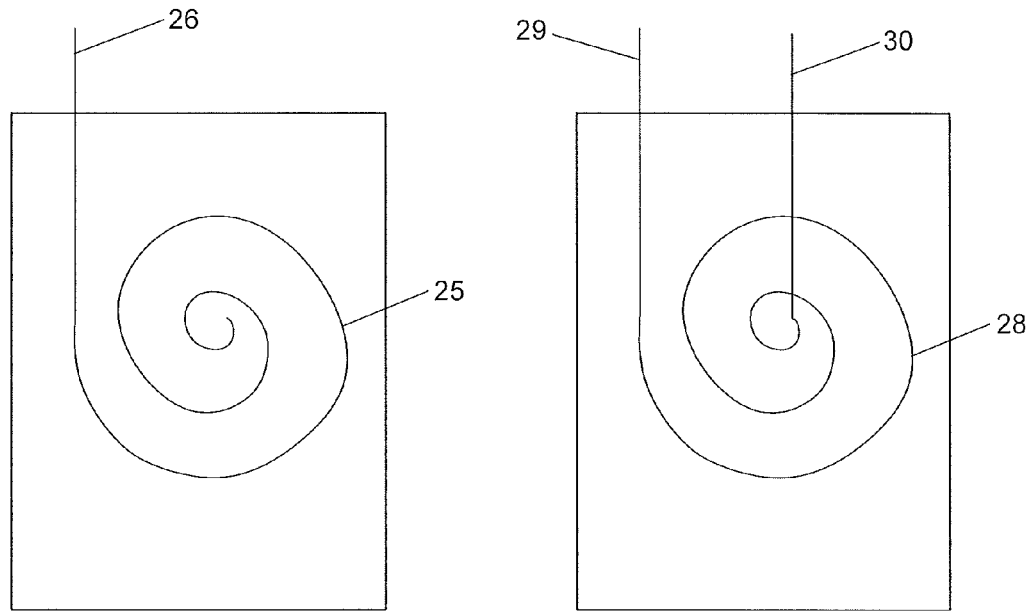

The second TCO pattern 28 of FIG. 7 is the same as that of FIG. 5, so is not described again. The first TCO pattern 25, however, is in the form of a spiral.

Figure 8:
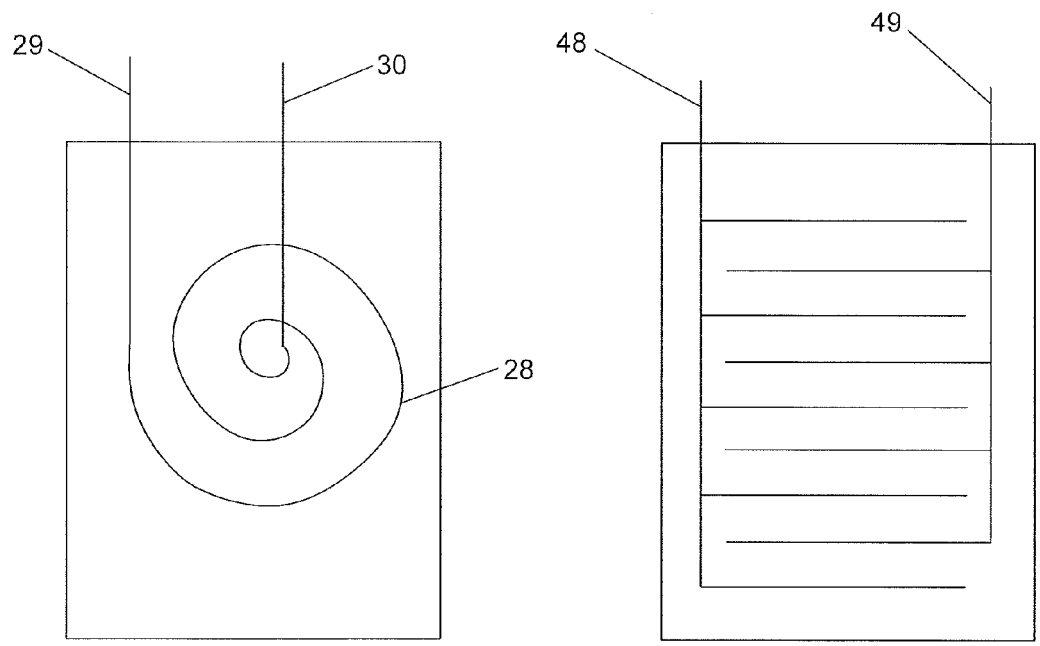

FIG. 8 illustrates a different type of transducer arrangement. Here, the rear face 24 of the transducer arrangement 15 is provided with base and emitter electrodes 48, 49. These are interdigitated but do not contact one another. In the presence of incident light, a PV voltage is generated across the base and emitter electrodes 48, 49.

On the front face 23 is a second TCO pattern 28. Here, the TCO pattern 28 is in the form of a loop, in this example a spiral. The second and third electrodes 29, 30 are connected at different ends of the loop of the second TCO pattern 28.

The second terminal 29 may be electrically connected to one of the base and emitter electrodes 48, 49, for instance the base electrode 48, so as to provide an arrangement with an electrical circuit corresponding to that of the arrangements of FIGS. 5 to 8.

Figure 9:
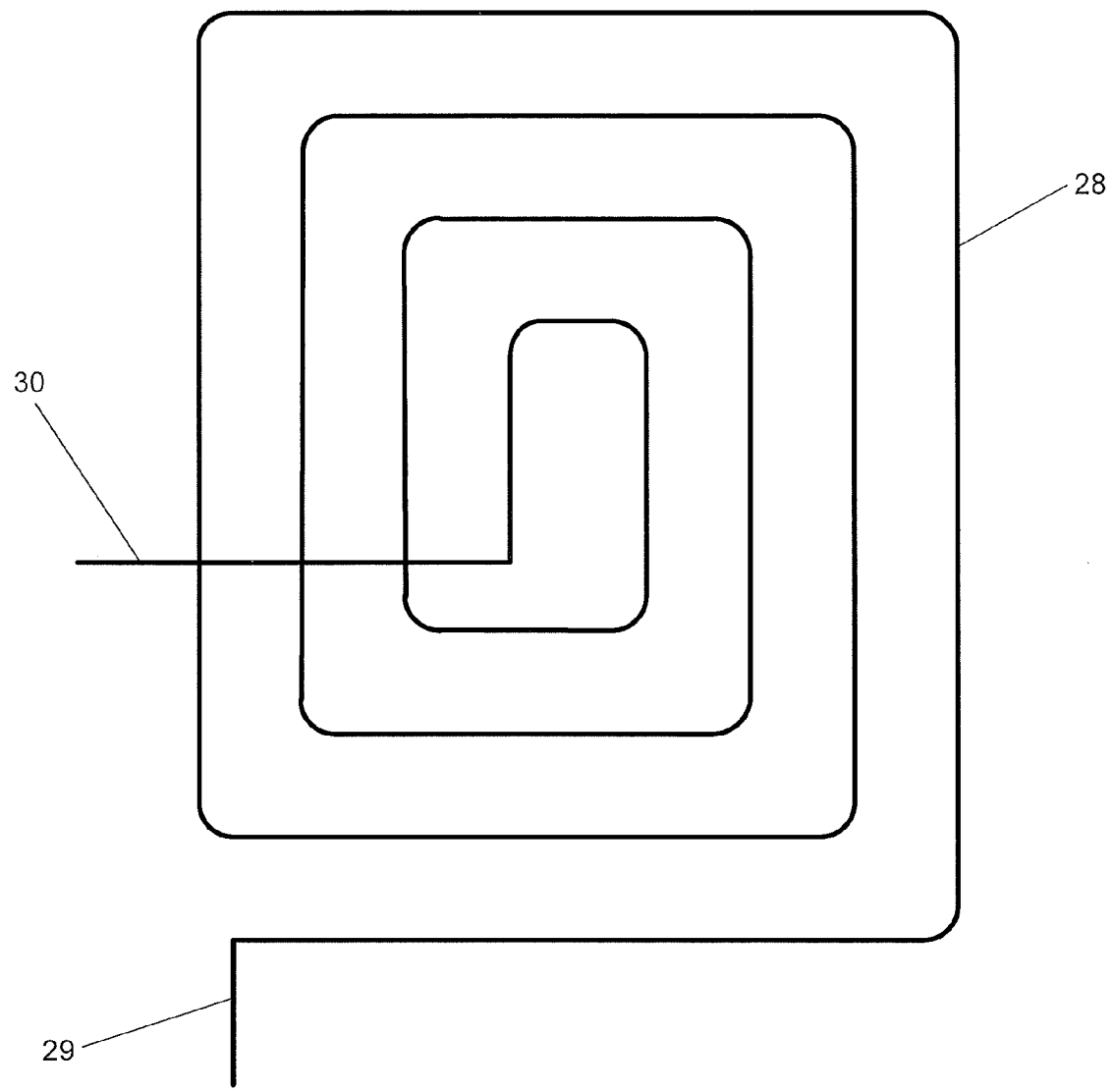
FIG. 9 is an alternative embodiment of part of the transducer arrangement of FIG. 2.

An alternative form for the second TCO pattern 28 is shown in FIG. 9. Here, the TCO pattern 28 takes the form of a square loop, or square spiral. The second and third terminals 29, 30 are connected at different ends of the loop. The loop may extend only partway towards the centre of the area in which the loop is formed, or the TCO pattern 28 may extends to a point close to the centre of the pattern. The latter alternative is shown in FIG. 9.

Although not shown in the Figures for the sake of clarity, the first and second TCO patterns 25, 28 each have a respective width, and also a respective thickness.

Using a square loop or spiral arrangement such as that shown in FIG. 9, the proportion of the area of the face 23, 24 on which the second TCO pattern 28 is formed may be increased. Such can increase the efficiency of the solar cell, compared to corresponding arrangements with a lower proportion of the area of the face 23, 24 being provided with the TCO pattern.

Figure 10:
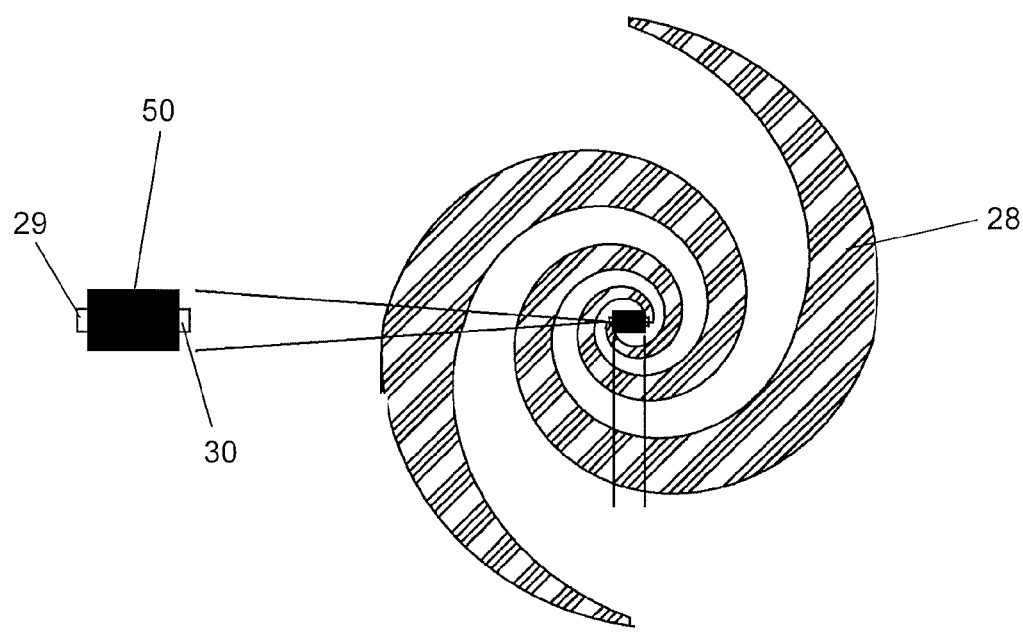
FIG. 10 is a further embodiment of a part of the transducer arrangement of FIG. 2.

FIG. 10 illustrates an alternative form for the TCO pattern 28. Here, a spiral antenna element comprising first and second limbs that are open at the external end to connect to the second and third terminals 29 and 30 are connected to one another at a central part of the TCO pattern 28 by a Schottky diode 50. The second and third terminals 29, 30 also are connected at the locations where the TCO pattern 28 contacts the Schottky diode. In particular, the second terminal 29 is connected at the inner end of the loop that is connected to the third terminal 30 at the outer end, and the third terminal 30 is connected to the inner end of the loop that is connected to the second terminal 29 at its outer end. Such a spiral antenna element can provide a broader frequency response than is possible with simpler loop or spiral configurations. The size of the Schottky diode package 50 limits the upper frequency for the antenna. The low frequency limit of the antenna is a function of the overall size of the TCO pattern 28. As shown in FIG. 10, each of the two limbs of the spiral pattern 28 progress from being relatively narrow at one end to being wider at a central portion and then becoming narrower again at the other end. Put another way, the limbs are thicker at their central portion than they are at their ends. The thickness of the limbs is graded along the length of the limbs.

Figure 11:
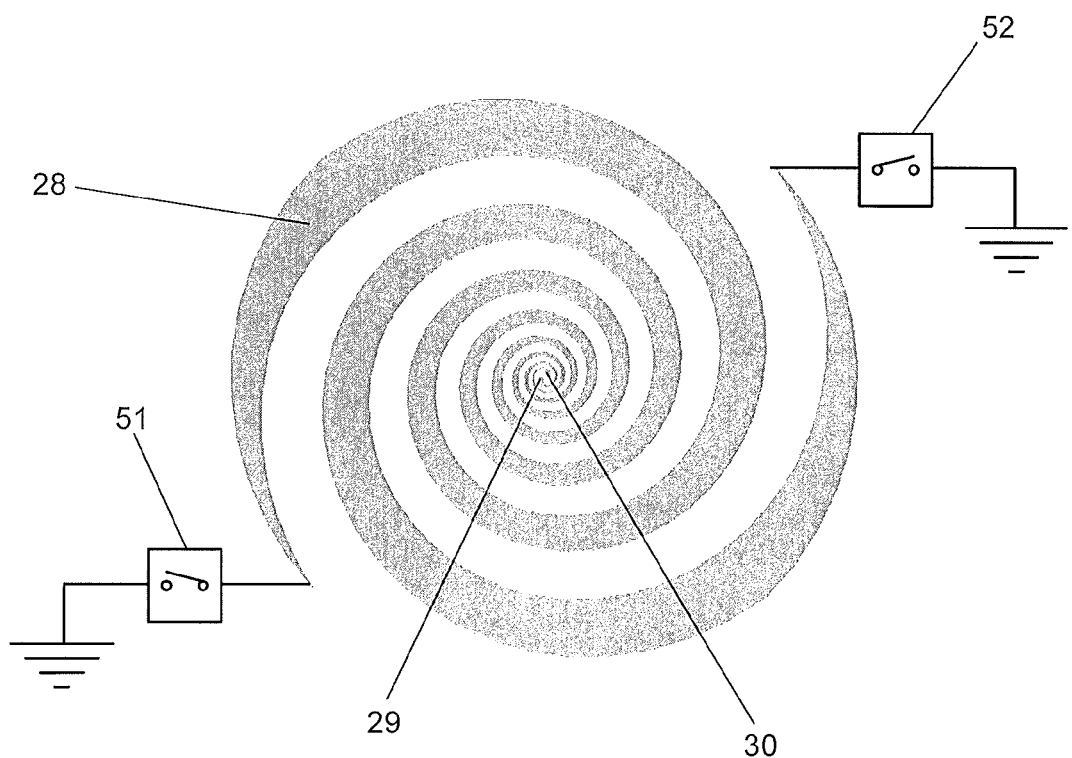
FIG. 11 is a still further embodiment of a part of the transducer arrangement of FIG. 2.

FIG. 11 shows a further alternative arrangement. Here, first and second loops of a spiral conductor pattern 28 are approximately the same as shown in FIG. 10. However, the pattern 28 of FIG. 11 is absent of Schottky diode or similar connecting the innermost ends of the loops. Instead, the second and third terminals 29, 30 are connected to different ones of the ends of the loops at the central part of the conductor pattern 28. Each outer end of the loop is selectively connected to ground potential by a respective switch 51, 52. The switches 51, 52 are closed when PV power is being used, and are open when EM power is being used. A rectifier (not shown in FIG. 11), sums potential differences provided by the two different loops in order to produce an EM harvesting potential difference.

In other embodiments, different combinations of first and second TCO patterns 25, 28 are used and all such combinations are hereby disclosed.

The skilled person will appreciate or be able to determine the response that will be experienced by a given TCO pattern 28 and will understand how to design a pattern 28 having regard to any given design criteria.

Although the embodiments have been described with reference to a P-N junction-type solar cell, other embodiments utilise other suitable types of solar cell. For instance other embodiments utilise a dye-sensitised solar cell (DSSC)

Although in the above embodiments the transducer arrangement 15 is described as being absent of a sheet-like metallised electrode, in some embodiments the transducer arrangement is provided with a partial reflector. The incorporation of the reflector may increase the effectiveness of the solar cell, by reducing the proportion of incident light that passes all the way through the transducer arrangement 15, but at the detriment of the effectiveness of the EM harvesting arrangement since the reflector necessarily would reduce electromagnetic field strength in the vicinity of the second TCO pattern 28.

It should be realised that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. An apparatus comprising:
a photovoltaic cell arrangement having:
a front surface and a rear surface, and
first and second conductor patterns formed on different ones of the front and rear surfaces,
wherein the first conductor pattern comprises at least one spiral loop having a first end and a second end,
and wherein the apparatus comprises at least a first terminal connected to the second conductor pattern, and second and third terminals connected to different ends of the at least one spiral loop of the first conductor pattern.

2. An apparatus as claimed in claim 1, comprising a power management module configured to power at least one electronic circuit with electrical power provided at the second and third terminals.

3. An apparatus as claimed in claim 1, comprising a power management module configured to power at least one electronic circuit with electrical power provided at the second and third terminals in response to a determination that electrical power provided at the second and third terminals is sufficient to power the at least one electronic circuit.

4. An apparatus as claimed in claim 1, comprising a power management module configured to power a core, comprising at least one of a microcontroller unit and a digital signal processor, with electrical power provided at the second and third terminals in response to a determination that the core is in a standby mode.

5. An apparatus as claimed in claim 4, wherein the power management module is configured to power the core with electrical power provided at the second and third terminals in response to a determination both that the core is in standby mode and that the electrical power provided at the second and third terminals exceeds a predetermined threshold.

6. An apparatus as claimed in claim 4, comprising a supercapacitor connected between an output of the power management module at which power is provided to power the core and a reference potential.

7. An apparatus as claimed in claim 1, wherein a power management module is configured to power at least one electronic circuit with electrical power provided at the first and second terminals in response to a determination that electrical power provided at the first and second terminals is sufficient to power the at least one electronic circuit.

8. An apparatus as claimed in claim 7, wherein the power management module is configured to connect the second terminal directly to the third terminal in response to the determination that electrical power provided at the first and second terminals is sufficient to power the at least one electronic circuit.

9. An apparatus as claimed in claim 1, wherein the first conductor pattern comprises plural loops each having respective first and second ends, wherein the second terminal is commonly connected to the first ends of the plural loops and wherein the third terminal is commonly connected to the second ends of the plural loops.

10. An apparatus as claimed in claim 1, wherein the first and second conductor patterns constitute different ones of first and second electrodes of the photovoltaic cell arrangement.

11. An apparatus as claimed in claim 10, wherein the apparatus is configured in a photovoltaic charging mode to short-circuit the second and third terminals and to provide power from the first and second terminals to a battery charging apparatus.

12. An apparatus as claimed in claim 1, wherein the photovoltaic cell arrangement comprises a back-junction type cell with the first conductor pattern being formed on the front surface of the semiconductor substrate and with the second conductor pattern and a third conductor pattern being formed on the rear surface of the semiconductor substrate, the second and third conductor patterns forming base and emitter electrodes respectively of the photovoltaic cell arrangement.

13. An apparatus as claimed in claim 9, wherein the first conductor pattern is formed of optically transparent material.

14. An apparatus as claimed in claim 1, wherein the loop is in the form of a square or rectangular shaped spiral.

15. A device comprising an apparatus as claimed in claim 1.

16. A transducer arrangement comprising:
a transducer body having:
   a front surface and a rear surface, and
   first and second conductor patterns formed on different ones of the front and rear surfaces,
wherein the first conductor pattern comprises at least one spiral loop having a first end and a second end,
wherein the transducer arrangement comprises at least a first terminal connected to the second conductor pattern, and second and third terminals connected to different ends of the at least one spiral loop of the first conductor pattern, wherein the transducer body and the first and second conductor patterns together form a photovoltaic transducer arrangement and wherein the second conductor pattern constitutes an induction transducer.

17. A device comprising a transducer arrangement as claimed in claim 16.

18. The device of claim 15, wherein the device is a mobile telephone.

19. The device of claim 17, wherein the device is a mobile telephone.

20. The apparatus of claim 1, wherein the spiral loop is in the form of a spiral pattern that progresses from being relatively narrow at the first end of the spiral loop to wider at a central portion of the spiral loop and then becoming narrower again at the second end of the spiral loop.

* * * * *